(12) United States Patent
Baek et al.

(10) Patent No.: US 7,307,340 B2
(45) Date of Patent: Dec. 11, 2007

(54) WAFER-LEVEL ELECTRONIC MODULES WITH INTEGRAL CONNECTOR CONTACTS

(75) Inventors: Seung Duk Baek, Gyeonggi-do (KR); Dong Hyeon Jang, Gyeonggi-do (KR); Gu Sung Kim, Gyeonggi-do (KR); Kang Wook Lee, Gyeonggi-Do (KR); Jae Sik Chung, Chungcheongnam-Do (KR)

(73) Assignee: Samsung Electronics Co., Ltd. (KR)

( * ) Notice: Subject to any disclaimer, the term of this patent is extended or adjusted under 35 U.S.C. 154(b) by 74 days.

(21) Appl. No.: 10/824,111

(22) Filed: Apr. 14, 2004

(65) Prior Publication Data

US 2005/0121770 A1    Jun. 9, 2005

(30) Foreign Application Priority Data

Dec. 5, 2003    (KR) .................... 10-2003-0088055

(51) Int. Cl.
*H01L 21/50* (2006.01)
*H01L 21/48* (2006.01)
*H01L 21/44* (2006.01)
*H01L 23/34* (2006.01)
*H01L 25/10* (2006.01)

(52) U.S. Cl. ............... 257/723; 257/724; 257/E25.023; 438/107; 438/110

(58) Field of Classification Search ........ 257/723–724, 257/E25.023; 438/107, 110
See application file for complete search history.

(56) References Cited

U.S. PATENT DOCUMENTS

| | | | |
|---|---|---|---|
| 4,685,998 A | 8/1987 | Quinn, Daniel J. et al. | |
| 5,661,339 A * | 8/1997 | Clayton | ....................... 257/678 |
| 5,874,770 A * | 2/1999 | Saia et al. | ................... 257/536 |
| 5,910,640 A | 6/1999 | Farnworth et al. | |
| RE36,469 E * | 12/1999 | Wood et al. | ................. 257/685 |
| 6,208,546 B1 | 3/2001 | Ikeda | |
| 6,210,993 B1 | 4/2001 | Farnworth et al. | |
| 6,348,728 B1 | 2/2002 | Aiba et al. | |
| 6,479,306 B1 | 11/2002 | Ikeda et al. | |
| 6,746,898 B2 * | 6/2004 | Lin et al. | ..................... 438/113 |
| 6,894,386 B2 * | 5/2005 | Poo et al. | .................... 257/730 |

(Continued)

OTHER PUBLICATIONS

Office Action, German Patent Appl. No. 10 2004 049 249.2-33, Sep. 29, 2005.

(Continued)

*Primary Examiner*—Luan Thai
(74) *Attorney, Agent, or Firm*—Myers Bigel Sibley & Sajovec, P.A.

(57) ABSTRACT

An electronic module comprises a monolithic microelectronic substrate including at least one integrated circuit die, e.g., a plurality of unseparated memory dice or a mixture of different types of integrated circuit dice. The monolithic substrate further includes a redistribution structure disposed on the at least one integrated circuit die and providing a connector contact coupled to the at least one integrated circuit die. For example, the connector contact may be configured as edge connector contact for the module. The redistribution structure may be configured to provide a passive electronic device, e.g., an inductor, capacitor and/or resistor, electrically coupled to the at least one integrated circuit die and/or the redistribution structure may comprise at least one conductive layer configured to provide electrical connection to a contact pad of an electronic device mounted on the substrate. Methods of fabricating electronic modules are also discussed.

38 Claims, 5 Drawing Sheets

U.S. PATENT DOCUMENTS

| | | |
|---|---|---|
| 7,074,696 B1 * | 7/2006 | Frankowsky et al. ....... 438/464 |
| 2002/0031858 A1 | 3/2002 | Kinsman et al. |
| 2002/0094602 A1 | 7/2002 | Her et al. |
| 2003/0122246 A1 | 7/2003 | Lin et al. |

OTHER PUBLICATIONS

Office Action, German Patent Appl. No. 10 2004 049 249.2-33, Aug. 9, 2006.

* cited by examiner

WAFER-LEVEL ELECTRONIC MODULES WITH INTEGRAL CONNECTOR CONTACTS

RELATED APPLICATION

This application claims priority from Korean Patent Application No. 2003-88055, filed on Dec. 5, 2003, the contents of-which are herein incorporated by reference in their entirety.

BACKGROUND OF THE INVENTION

The present invention relates to electronic modules, and more particularly, to wafer level modules and methods of fabrication therefor.

A typical conventional electronic module, such as a memory module, may include a plurality of packaged integrated circuit devices attached to a printed circuit board (PCB). The integrated circuit devices may be packaged in a number of different form factors, including traditional thru-hole packaging and surface mount (SMT) packaging conducive to manual and/or wave soldering techniques, as well as chip scale packaging (CSP) and wafer level chip scale packaging (WLCSP) that is configured for PCB attachment using solder ball techniques.

FIG. 1 shows a conventional module having WLCSP devices 50 mounted on a PCB 10. Though not shown in the drawing, the PCB 10 includes circuit traces that interconnect the devices 50 and passive devices 70, e.g., inductors, capacitors and resistors. The PCB 10 further includes edge connector contacts 12, which are configured to contact blades of an edge connector (not shown) that engages the edge of the PCB 10.

FIG. 2 is a cross-sectional view taken along the line II-II of FIG. 1. As shown, solder balls 57 connect the WLCSP devices 50 with the PCB 10. FIG. 3 shows an enlarged view of a portion of the WLCSP device 50, which includes a semiconductor substrate 51, a passivation layer 53, chip pads 52, a patterned redistribution layer 54, and a protective layer 55. The solder ball 57 contacts an exposed portion of the redistribution layer 54.

Conventional device packaging and interconnection technologies appear to be approaching a minimum feature size limit that may constrain designers' ability to further reduce the size of modules. Moreover, techniques that use soldered connections may present reliability and environmental problems. For example, for the module shown in FIGS. 1 and 2, mechanical shear stress on the solder balls induced by mismatch in thermal expansion coefficients of the device 50 and the PCB 10 may cause failure of the solder joint. In addition, the lead content of conventional solders can pose environmental issues.

SUMMARY OF THE INVENTION

According to some embodiments of the present invention, an electronic module includes a monolithic microelectronic substrate including at least one integrated circuit die, for example, a plurality of unseparated memory dice or an assortment of different types of integrated circuit dice. The monolithic substrate further includes a distribution structure disposed on the at least one integrated circuit die and providing a connector contact coupled to the at least one integrated circuit die. For example, the connector contact may be configured as an edge connector contact for the module.

In further embodiments, the redistribution structure may be configured to provide a passive electronic device, e.g., an inductor, capacitor and/or resistor, electrically coupled to the at least one integrated circuit die. According to still further embodiments, the redistribution structure may include at least one conductive layer configured to provide electrical connection to a contact pad of an electronic device mounted on the substrate. The module may further include a support layer and/or a protection layer affixed to a surface of the monolithic substrate. For example, the support layer and/or protection layer may be a metal plate or a thermally conductive polymer layer attached to the substrate using a thermal tape. The support and/or protection layer may be configured to serve as a heat sink.

In further embodiments of the present invention, an electronic module includes a microelectronic substrate including at least one integrated circuit die therein. The module further includes a redistribution structure including interleaved conductive and insulation layers formed on the at least one integrated circuit die. The redistribution structure includes at least one conductive layer including a compressive connector contact coupled to the at least one integrated circuit die.

According to further embodiments, an article of manufacture includes a wafer having a plurality of integrated circuit dice therein and a redistribution structure on the plurality of integrated circuit dice. The redistribution structure includes a connector contact coupled to at least one of the plurality of integrated circuit dice. The wafer may include a plurality of groups of integrated circuit dice and a plurality of redistribution structures disposed on and coupled to respective ones of the groups of integrated circuit dice, each of the redistribution structures including a connector contact. The plurality of groups of integrated circuit dice and associated redistribution structures may be separable into a plurality of modules.

In additional embodiments of the present invention, an electronic module includes a monolithic microelectronic substrate including a plurality of unseparated integrated circuit dice and a multilayer redistribution structure including interleaved conductive and insulation layers on the plurality of unseparated integrated circuit dice. The redistribution structure includes at least one conductive layer including an edge connector contact electrically coupled to at least one of the plurality of integrated circuit dice. One or more protection layers may be affixed to the substrate, and may be configured to support the edge connector contact.

According to some method embodiments of the present invention, an electronic module is fabricated by forming a plurality of integrated circuit dice and a redistribution structure on a wafer. The redistribution structure is coupled to the plurality of integrated circuit dice and includes a connector contact. The plurality of integrated circuit dice and the redistribution structure may be separated from an adjacent portion of the wafer to provide an electronic module. The connector contact may be configured to serve as an edge connector contact for the module.

DETAILED DESCRIPTION OF EXEMPLARY EMBODIMENTS

Figure 1:
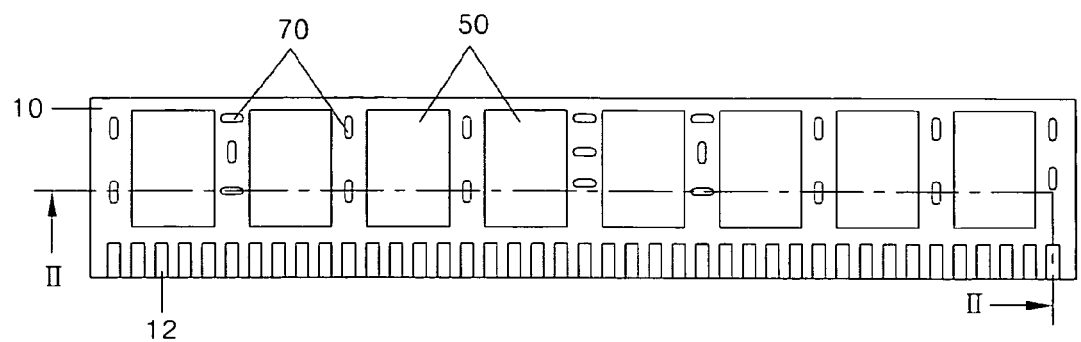
FIGS. 1-3 are various views of a conventional electronic module.
Figure 2:
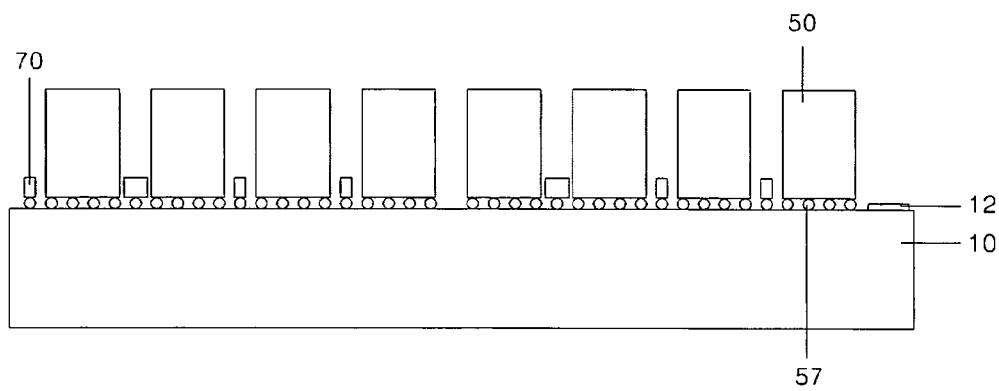
Figure 3:
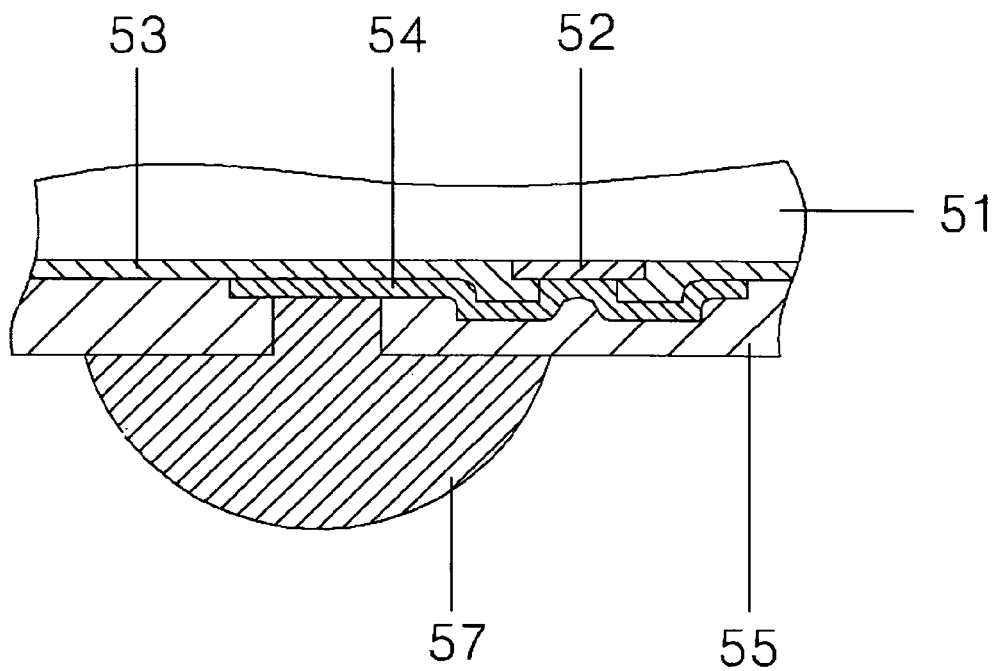

The present invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present. Furthermore, relative terms, such as "beneath," may be used herein to describe relationships among elements as illustrated in the drawings. It will be understood that relative terms are intended to encompass different orientations of the device in addition to the orientation depicted in the drawings. For example, if the device in the drawings is turned over, elements described as "below" other elements would then be oriented "above" the other elements. The exemplary term "below," therefore, encompasses both an orientation of above and below.

It will be understood that although the terms "first" and "second" are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. As used herein the term "and/or" includes any and all combinations of one or more of the associated listed items. Like numbers refer to like elements throughout.

Figure 4:
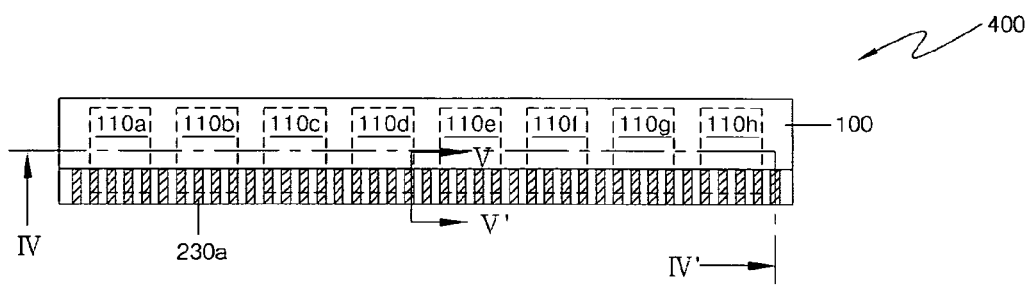
FIG. 4 is top view of a wafer-level module according to some embodiments of the present invention.
Figure 5:
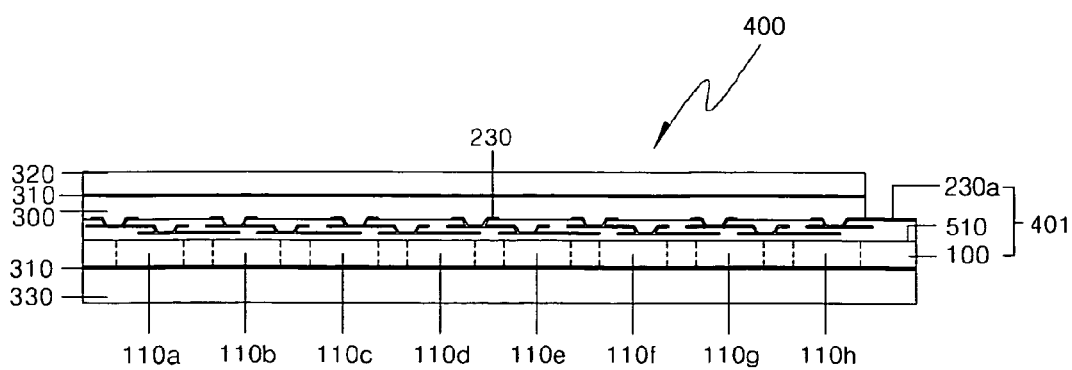
FIGS. 5 and 6 are side views of the wafer-level module of FIG. 4.

FIGS. 4 and 5 illustrate an electronic module 400 according to some embodiments of the present invention. The module 400 includes a monolithic substrate 401 including a substrate 100 in which integrated circuit dice 110a-110h are formed, and an overlying redistribution structure 510 including interleaved conductive and insulating layers. The dice 110a, 110h may be identical or may be different. For example, the dice 110a-110h may include only memory devices or may include a combination of one or more memory devices and one or more other functional devices, such as microprocessors, memory controllers, or other integrated circuit devices. The redistribution structure 510 includes a conductive layer 230 including a plurality of connector contacts 230a, i.e., contacts that are configured to be engaged by mating contacts of a removable connector. In the illustrated embodiments, the contacts 230a are configured to be engaged in a compressive manner by contacts of an edge connector (not shown) that engages the edge of the module 400. Accordingly, the module 400 can be fabricated without soldered connections. It will be appreciated that integral contacts may be configured in other ways in other embodiments of the present invention. For example, a monolithic substrate may include contacts positioned at other locations than an edge, such as contacts configured to be compressively engaged by a clamping (e.g., zero insertion force) connector or module carrier.

FIG. 5 is a cross-sectional view taken along the line IV-IV' of FIG. 4. Disposed on an upper surface of the substrate 100, the redistribution structure 510 overlies the dice 110a-110h. A protection layer 300 is disposed on the redistribution structure 510, but does not cover portions of the conductive redistribution layer 230 that serve as the edge connector contacts 230a. Second and third protection layers 320, 330 are disposed on the first protection layer 300 and on a lower surface of the substrate 100, respectively. The second and third protection layers 320, 330 may be formed from materials with relatively high thermal conductivity so that the second and third protection layers 320, 330 may act as heat sinks. For example, the second and third protection layers 320, 330 may be metal plates and/or thermally conductive polymer layers that are attached to the substrate 100 by adhesive layers, such as thermal tapes 310. The protection layers may provide mechanical support for the integral contacts formed in the substrate. For example, as shown in FIG. 5, the lower protection layer 330 may extend underneath the contacts 230a to provide mechanical support when an edge connector is attached.

Figure 6:
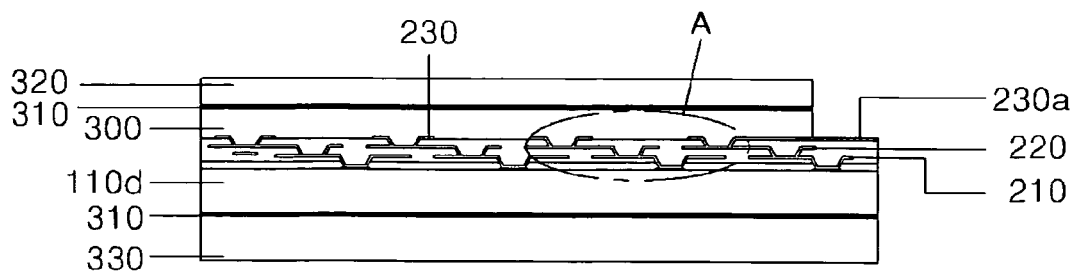
Figure 7:
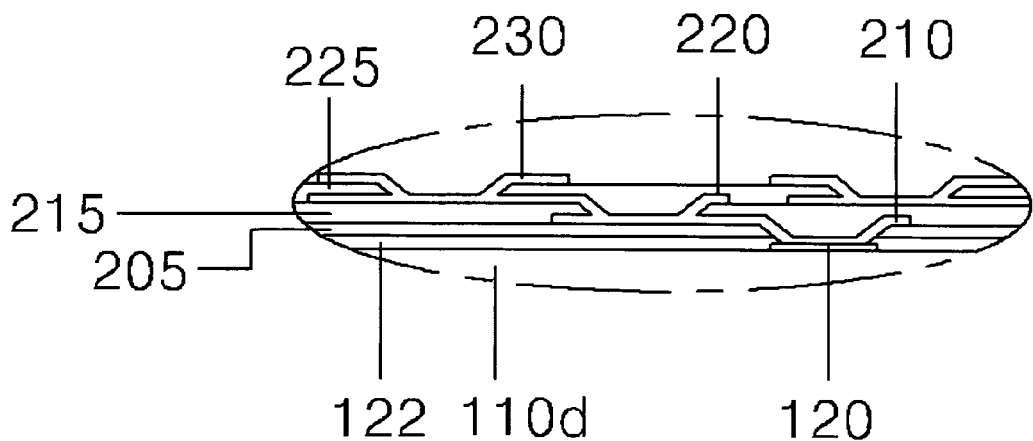
FIG. 7 is a detailed view of a wafer-level module of FIG. 4.

FIG. 6 is a cross-sectional view taken along the line V-V' of FIG. 4, and FIG. 7 is an enlarged view of a portion of the module indicated by the dashed line A in FIG. 6. A die 110d has one or more chip pads 120 that are exposed through an opening in a passivation layer 122. As shown, the redistribution structure 510 includes a first conductive redistribution layer 210, a second conductive redistribution layer 220, a third conductive redistribution layer 230, a first insulating layer 205, a second insulating layer 215 and a third insulating layer 225. Contact holes are formed through the insulating layers 205, 215, 225 to interconnect the redistribution layers 210, 220, 230 and the die 110d. It will be appreciated that the illustrated redistribution structure 510 is provided for exemplary purposes, and that redistribution structures with various different numbers and/or configurations of conductive layers and insulating layers may be used in various embodiments of the present invention.

Figure 8:
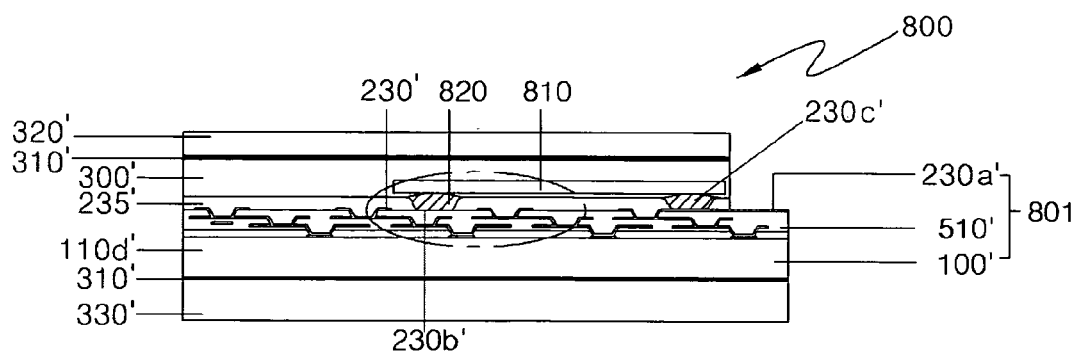
FIG. 8 is a side view of a wafer-level module according to further embodiments of the present invention.
Figure 9:
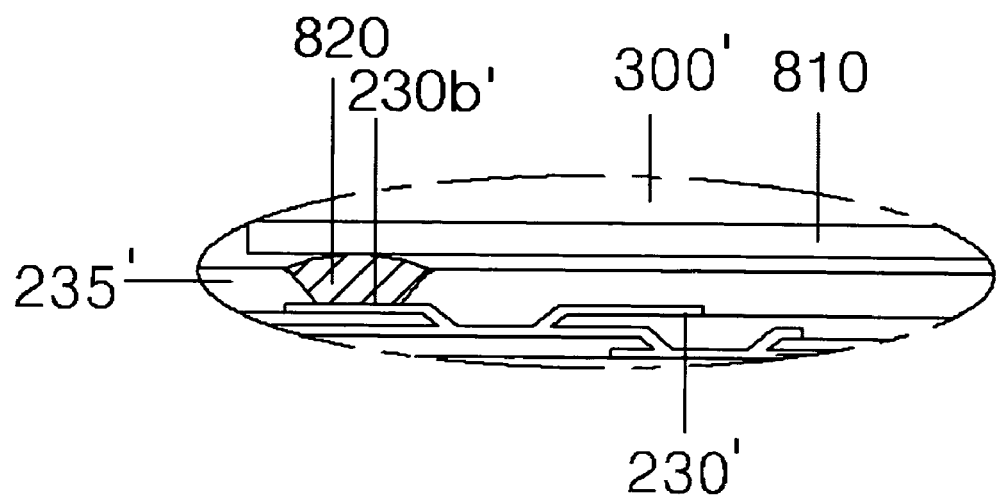
FIG. 9 is a detailed view of the wafer-level module of FIG. 8.

According to further embodiments of the present invention, a monolithic substrate with one or more integral connector contacts, as exemplified by FIGS. 6 and 7, may be combined with conventionally mounted devices, such as active or passive devices configured for solder ball mounting. FIG. 8 is a cross-sectional view of a module 800 according to further embodiments of the present invention, and FIG. 9 is an enlarged view of a portion of the module 800 indicated by a dashed line B in FIG. 8. The module 800 includes a monolithic substrate 801 include a substrate 100' in which one or more dice 110' are formed and an overlying redistribution structure 510', along with a first protection layer 300' and second and third protection layers 320', 330' attached to the monolithic substrate by tapes 310', similar to the embodiments of FIGS. 6 and 7. The redistribution structure 510' includes an upper insulating layer 235' upon which an electronic device 810 disposed. The electronic device 810, which may be an active or passive device, is electrically connected to a conductive layer 230' of the redistribution structure 510' at first and second lands 230b', 230c' by solder balls 820 that extend into openings in the insulating layer 235. The conductive layer 230' further includes a compressive edge connector contact 230a'.

Figure 10:
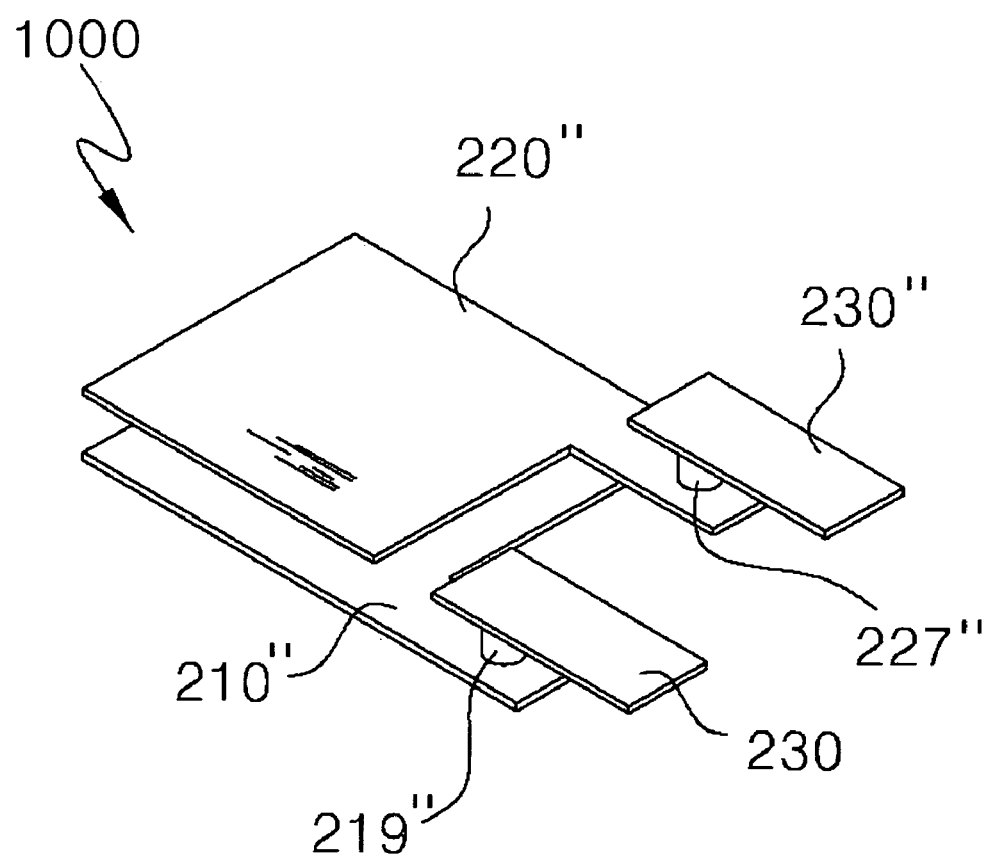
FIGS. 10 and 11 are perspective views of respective capacitor and inductor structures embedded in a redistribution structure of a wafer-level module according to further embodiments of the invention.
Figure 11:
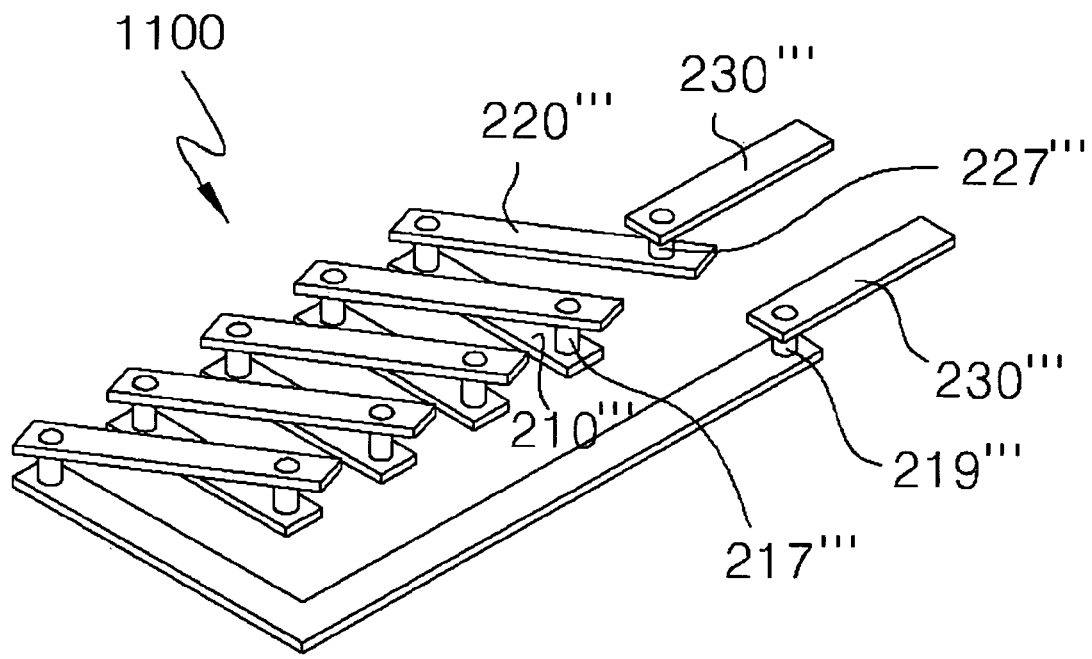

According to further embodiments of the present invention, electronic devices, such as resistors, capacitors and/or inductors, may be incorporated within a redistribution structure of a monolithic substrate, such as those illustrated in FIGS. 6-9. For example, referring to FIG. 10, a capacitor 1000 may be formed from first and second conductive layers 210", 220" of a redistribution structure, with the intervening insulating layer (not shown in FIG. 10) serving as a capacitor dielectric. Electrodes formed in the layers 210", 220" may be coupled to traces in another layer 230" of the redistribution structure using vias 219", 227". Similarly, referring to FIG. 11, an inductor 1100 may be formed from first and second conductive layers 210''', 220''' of a redistribution structure in conjunction with vias 217'''. Ends of the inductor may be coupled to a third conductive layer 230''' of the redistribution structure by vias 219''', 227'''. It will be appreciated that other circuit elements may be embedded within a redistribution structure in a similar manner. For example, a resistor may be formed from a reduced-cross-section portion of a conductive trace in a conductive layer of a redistribution structure. Embedded circuit elements may be interconnected to form specific functional circuitry, such as passive filters or other tuned circuits. It will be appreciated that, in some embodiments of the present invention, such embedded circuitry may be combined with devices mounted on the monolithic substrate as shown, for example, in FIGS. 8 and 9.

Figure 12:
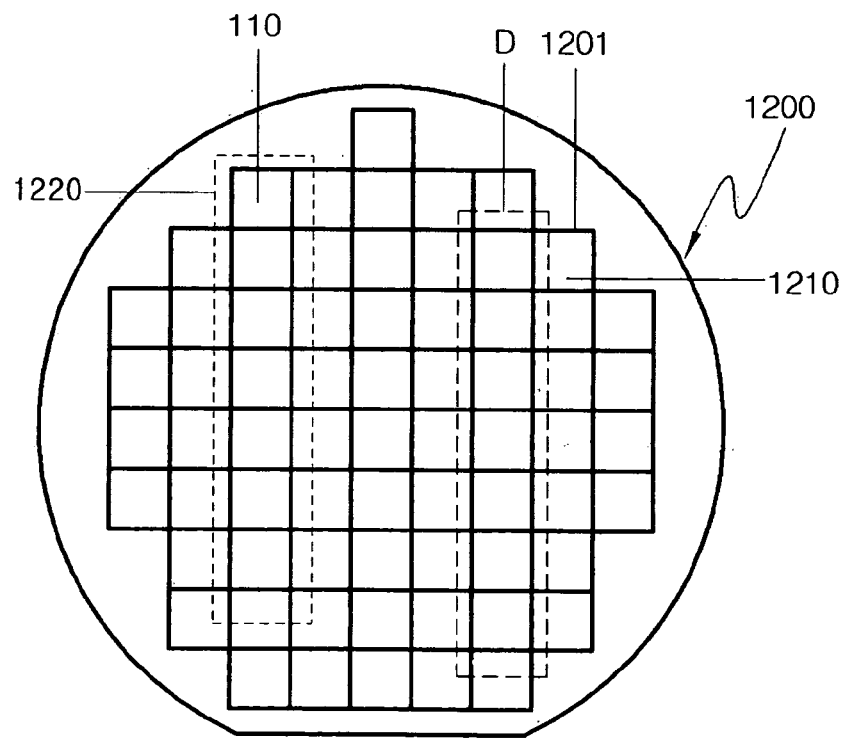
FIG. 12 is a top view of a semiconductor wafer illustrating exemplary operations for forming wafer level modules according to some embodiments of the present invention.

Referring now to FIG. 12 in conjunction with FIGS. 4-7, exemplary operations for fabricating a wafer level integrated circuit device according to some embodiments of the present invention will now be described. A wafer 1200 is provided as shown in FIG. 12. The wafer 1200 includes a plurality of integrated circuit dice 110 therein, separated by scribe lanes 1201. The wafer 1200 may be a silicon wafer, a silicon-on-insulator (SOI) wafer, a gallium arsenide wafer, a silicon germanium wafer, a ceramic wafer, a quartz wafer, or some other material. The die 110 may be grouped into groups 1210, 1220, which will later be separated in forming multi-dice modules from the wafer 1200. Although the groups 1210, 1220 illustrated in FIG. 12 have the same number of dice, it will be appreciated that the various groups may include differing numbers or arrangements of dice, and the dice in the various groups may have differing functional compositions.

The dice 110 may have pads 120 exposed through openings in a passivation layer 122, as shown in FIG. 7. A first insulating layer 205 of a redistribution structure 510 is formed on the passivation layer 122, and has holes therein that expose the pads 120. A first patterned conductive layer 210 of the redistribution structure 510 is formed on the first insulating layer 205, with the first conductive layer 210 being connected to the pads 120 through the contact holes in the first insulating layer 210. A second insulating layer 215, a second patterned conductive layer 220, a third insulating layer 225 and a patterned conductive layer 230 of the redistribution structure are formed using sequential deposition and patterning steps.

The patterned conductive layers of the redistribution structure 510 may be formed of, for example, copper (Cu), aluminum (Al), zinc (Zn), platinum (Pt), cobalt (Co), lead (Pb), and/or nickel (Ni). Various techniques may be used to form the layers, including, but not limited to, deposition and patterning by photolithography, screen-printing and curing a conductive paste, and/or electro- or electroless metal plating. The insulating layers of the redistribution structure 510 may be formed from a material having low moisture uptake, low dielectric constant and low mismatch in thermal expansion coefficient with the material of the wafer 1200. Examples of materials that may be used include BCB (BenzoCycloButens), polybenzoxazole, polyimide, epoxy, silicon oxide and/or silicon nitride. BCB, polybenzoxazole, polyimide and/or or epoxy layers may be formed, for example, by spin coating and thermal curing. Silicon oxide or silicon nitride layers may be formed, for example, by chemical vapor deposition (CVD), such as high-density plasma (HDP) CVD.

Still referring to FIGS. 4-7 and 12, the first protection layer 300 is formed on the redistribution structure 510 such that the edge connector contacts 230a remain exposed. The first protection layer 300 may be, for example, an epoxy resin layer and/or a polyimide layer having a thickness from about 2 µm to around 50 µm. Optionally, the first protection layer 300 may be omitted. Prior to forming the first protection layer 300, electrical tests may be performed to insure that the dice 110 and the redistribution structure 510 operate properly.

A lower surface of the wafer 1200 is subjected to a grinding process to thin the wafer 1200. The groups of dice 1210, 1220 are separated, e.g., referring to FIGS. 4-7, the substrate 100 is cut from the wafer 1200 along selected ones of the scribe lanes 1201 using, for example, a conventional sawing technique. The substrate 100 includes a subarray of the dice 110.

The second and third protection layers 320, 330 may then be formed on the separated substrate 100. The second protection layer 320 and the third protection layer 330 may include, for example, metal plates or thermally conductive polymer layers that are affixed by adhesive and/or tape and/or conformal layers formed, for example, by a plating process and/or by physical vapor deposition (PVD). Additional electronic devices may be mounted on the substrate 100 before formation of the second and third protection layer 320, 330, as shown, for example, in FIGS. 8 and 9.

According to some embodiments of the present invention, further reduction of the size of electronic modules may be achieved by forming a monolithic microelectronic substrate including one or more integrated circuit dice and a redistribution structure thereon that includes a connector contact coupled to the one or more integrated circuit dice. Because the redistribution structure may be formed over the dice, the surface area needed to interconnect the dice and provide an edge connector can be significantly reduced. In addition, a module can be fabricated without requiring the use of soldered connections, or with a reduced number of soldered connections.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. An electronic module, comprising:
   a monolithic microelectronic substrate including a plurality of integrated circuit dice and a redistribution structure across the dice thereon providing an edge connector contact coupled to at least one of the plurality of integrated circuit dice, the edge connector contact configured for mating with a contact of an edge connector that is configured to engage an edge of the substrate, wherein the plurality of dice are electrically connected to one another via the redistribution structure.

2. A module according to claim 1, wherein the monolithic substrate comprises a plurality of unseparated integrated circuit dice.

3. A module according to claim 1, wherein the redistribution structure is configured to provide a passive electronic device electrically coupled to at least one of the plurality of integrated circuit die.

4. A module according to claim 3, wherein the passive electronic device comprises a capacitor, a resistor and/or an inductor.

5. A module according to claim 1, wherein the redistribution structure comprises a land configured to provide electrical connection to a contact pad of an electronic device mounted on the substrate.

6. A module according to claim 5, further comprising an electronic device mounted on the substrate and having a contact pad electrically coupled to the land.

7. A module according to claim 1, further comprising a support layer affixed to a surface of the monolithic substrate and configured to support the connector contact.

8. A module according to claim 7, wherein the support layer is configured to serve as a heat sink.

9. A module according to claim 1, further comprising a protection layer affixed to a surface of the monolithic substrate.

10. A module according to claim 9, wherein the protection layer is configured to serve as a heat sink.

11. An electronic module, comprising:
a microelectronic substrate including a plurality of integrated circuit dice therein; and
a redistribution structure comprising interleaved conductive and insulation layers formed on the plurality of integrated circuit dice, the redistribution structure extending across a surface of the substrate to overlie at least portions of each of the plurality of integrated circuit dice and including at least one conductive layer including a compressive connector contact opposite the surface of the substrate and coupled to at least one of the plurality of integrated circuit dice, the redistribution structure electrically connecting the plurality of dice to one another.

12. A module according to claim 11, wherein the connector contact comprises an edge connector contact configured for mating with a contact of an edge connector that is configured to engage an edge of the substrate.

13. A module according to claim 11, wherein the plurality of integrated circuit dice comprises a plurality of unseparated integrated circuit dice.

14. A module according to claim 11, wherein the redistribution structure is configured to provide a passive electronic device electrically coupled to at least one of the plurality of integrated circuit dice.

15. A module according to claim 14, wherein the passive electronic device comprises a capacitor, a resistor and/or an inductor.

16. A module according to claim 10, wherein the redistribution structure comprises at least one conductive layer configured to provide electrical connection to a contact pad of an electronic device mounted on the substrate.

17. A module according to claim 16, further comprising an electronic device mounted on the substrate and having a contact pad electrically coupled to the at least one conductive layer.

18. A module according to claim 11, further comprising a support layer affixed to a surface of the monolithic substrate and configured to support the connector contact.

19. A module according to claim 18, wherein the support layer is configured to serve as a heat sink.

20. A module according to claim 11, further comprising a protection layer affixed to a surface of the substrate.

21. A module according to claim 20, wherein the protection layer is configured to serve as a heat sink.

22. An article of manufacture, comprising:
a wafer having a plurality of integrated circuit dice therein and a redistribution structure extending across a surface of the wafer to overlie at least portions of each of the plurality of integrated circuit dice, the redistribution structure including a connector contact facing opposite the surface of the wafer and coupled to at least one of the plurality of integrated circuit dice, the redistribution structure electrically connecting the plurality of dice to one another.

23. An article according to claim 22, wherein the wafer comprises a plurality of groups of integrated circuit dice and a plurality of redistribution structures disposed on and coupled to respective ones of the groups of integrated circuit dice, each of the redistribution structures including a connector contact.

24. An article according to claim 23, wherein the plurality of groups of integrated circuit dice and associated redistribution structures are separable into a plurality of modules.

25. An article according to claim 24, wherein the connector contacts of the respective redistribution structures are configured to provide edge connector contacts for the respective modules.

26. An electronic module, comprising:
a monolithic microelectronic substrate including a plurality of unseparated integrated circuit dice and a multilayer redistribution structure comprising interleaved conductive and insulation layers, the redistribution structure extending across a side of the substrate to overlie at least portions of each of the plurality of unseparated integrated circuit dice, the redistribution structure including at least one conductive layer including an edge connector contact facing opposite the side of the substrate and electrically coupled to at least one of the plurality of integrated circuit dice, the redistribution structure electrically connecting the plurality of dice to one another.

27. A module according to claim 26, further comprising a protection layer affixed to the substrate.

28. A module according to claim 27, wherein the protection layer is configured to support the edge connector contact.

29. A module according to claim 27, wherein the edge connector contact is disposed adjacent an edge of the substrate, and wherein the protection layer is disposed on a surface of the substrate opposite the redistribution structure and underlies the edge connector contact.

30. A module according to claim 27, wherein the protection layer is configured to serve as a heat sink.

31. A module according to claim 27, wherein the protection layer comprises at least one of a metal layer or a thermally conductive polymer layer.

32. A module according to claim 27, wherein the protection layer comprises first and second protection layers affixed to respective ones of the substrate and the redistribution structure.

33. A module according to claim 26, wherein the plurality of unseparated integrated circuit dice comprises a plurality of integrated circuit memory devices.

34. A module according to claim 26, wherein the redistribution structure provides interconnections among the plurality of integrated circuit dice.

35. A module according to claim 26, wherein the redistribution structure comprises a passive electronic device.

36. A module according to claim 35, wherein the passive electronic device comprises a capacitor, a resistor and/or an inductor.

37. A module according to claim 26, wherein the redistribution structure includes at least one conductive layer configured to provide an electrical contact for an electronic device mounted on the substrate.

38. A module according to claim 37, further comprising an electronic device mounted on the substrate and in electrical contact with the at least one conductive layer.

* * * * *